United States Patent
Yang

(10) Patent No.: US 7,202,599 B2
(45) Date of Patent: Apr. 10, 2007

(54) WHITE LIGHT LIGHT-EMITTING DEVICE

(75) Inventor: Sammy Yang, Taipei (TW)

(73) Assignee: Luminoso Photoelectric Techtology Co., Ltd., Lujhou (TW)

( * ) Notice: Subject to any disclaimer, the term of this patent is extended or adjusted under 35 U.S.C. 154(b) by 357 days.

(21) Appl. No.: 10/968,878

(22) Filed: Oct. 21, 2004

(65) Prior Publication Data

US 2006/0087221 A1   Apr. 27, 2006

(51) Int. Cl.
*H01J 1/62* (2006.01)
*H01J 63/04* (2006.01)

(52) U.S. Cl. ............... 313/504; 313/498; 313/506; 313/512; 257/100

(58) Field of Classification Search ........ 313/498–504, 313/506, 512; 257/98–100
See application file for complete search history.

(56) References Cited

U.S. PATENT DOCUMENTS 6,605,904 B2 *  8/2003  Jenekhe et al. .......... 315/169.3
6,844,670 B2 *  1/2005  Kuma et al. .............. 313/501
2006/0172147 A1 * 8/2006  Matsuura et al. .......... 428/690

* cited by examiner

*Primary Examiner*—Mariceli Santiago
*Assistant Examiner*—Kevin Quarterman
(74) *Attorney, Agent, or Firm*—Protechtor Int'l Services

(57) ABSTRACT

A white light light-emitting device includes a light-emitting chip, functioning as a light-emitting light source, and light emitted has a wavelength between 340 nm~495 nm, a macromolecular organic polymer is utilized to form an organic phosphor layer by means of adhering by evaporation onto a surface of the light-emitting chip; and an encapsulated layer, which encloses the light-emitting chip and the organic phosphor layer. Light emitted from the light source of the light-emitting chip excites the organic phosphor layer, which is thus affected to emit a second light having a wavelength (between 530 nm~580 nm) different from that of the light-emitting light source. Wavelengths of the second light and a portion of the light source are mutually mixed thereby forming a mixed light and being affected by a plurality of nanograde crystal grains within the encapsulated layer, thus attaining white light having superior uniformity and color rendering.

5 Claims, 3 Drawing Sheets

WHITE LIGHT LIGHT-EMITTING DEVICE

BACKGROUND OF THE INVENTION (a) Field of the Invention

The present invention relates to a white light light-emitting device, and more particularly to a light-emitting device that is able to emit white light having superior color rendering and that is more uniform.

(b) Description of the Prior Art

With reference to Taiwan publication No. 383508, entitled Light-emitting Device, Taiwan publication No. 385063, entitled White Light LED, Taiwan publication No. 556365, entitled Method of Manufacturing White Light Light-emitting Diode Light Source, and Taiwan publication No. 465123, entitled High Power White Light-emitting Diode, the aforementioned light emitting devices all utilize inorganic polymer components (such as YAG (yttrium aluminum garnet) yellow phosphor layer. However, because when a phosphor layer is coated on a surface and a periphery of a light-emitting member (LED light-emitting diode), uniformity of the phosphor layer and adhesion is unable to be effectively controlled, thus excited mixed light (white light) becomes mutually intermixed and non-uniform, for instance, the white light may have a blue bias at a center and a yellow bias at a periphery. Although the naked eye might see white light, however, when the mixed light is projected onto pure white paper, then a central blue color and a yellow bias around the periphery is apparent.

Hence, subject of the present invention is resolving and surmounting existent technical difficulties to invent a light-emitting device that is capable of emitting white light having superior color and better uniformity.

SUMMARY OF THE INVENTION

Accordingly, a primary objective of the present invention is to provide a white light light-emitting device that embodies an organic phosphor layer, which is an organic light-emitting polymer that has been adhered in a gasified state onto a light-emitting member by means of evaporation, wherein the organic phosphor body is encapsulated within an encapsulated layer that is provided with characteristic properties of light focusing and light refracting, and therewith color of mixed light (white light) excited from the white light light-emitting device is provided with superior uniformity and color rendering.

Referring to FIGS. 1, 2 and 3, the present invention provides a white light light-emitting device comprising:

A light-emitting chip 10, which functions as a light-emitting light source 15, and light emitted from the light source 15 has a wavelength between 340 nm~495 nm. A macromolecular organic polymer is utilized to form an organic phosphor layer 20 by means of adhering by evaporation onto a surface 12 of the light-emitting chip 10.

An encapsulated layer 40, which provides uniform diffused light, and encapsulates and thereby encloses the light-emitting chip 10 and the organic phosphor layer 20.

Light emitted from the light source 15 of the light-emitting chip 10 excites the organic phosphor layer 20, which is thus affected to emit a second light 30 having a wavelength (between 530 nm ~580 nm) different from that of the light-emitting light source 15. Wavelengths of the second light 30 and a portion of the light source 15 that has not undergone excitation are mutually mixed within the encapsulated layer 40, thereby forming a mixed light 35. A plurality of nanograde crystal grains 44 within the encapsulated layer 40 affect focusing and refracting of light rays of the mixed light 35 within the encapsulated layer 40, whereby the mixed light 35 becomes even more uniformly mixed, and which is subsequently emitted outward from the encapsulated layer 40, thus attaining white light 36 having superior uniformity and color rendering.

According to the aforementioned primary characteristics, chemical formula of material of the organic phosphor layer 20 is $(CHCHSC_2CONC_6H_5)_2C_{10}H_7$.

According to the aforementioned primary characteristics, material of the encapsulated layer 40 is compounded from mutual mixing of transparent resin 42 and the nanograde crystal grains 44, wherein the nanograde crystal grains 44 are transparent or translucent bodies, and size of particles of the nanograde crystal grains 44 is controlled to be 100 nanos. The nanograde crystal grains 44 have physical properties of light focusing and light refracting.

According to the aforementioned primary characteristics, the organic phosphor layer 20 is formed from high-temperature gasified organic phosphor material, which is adhered by evaporation onto the surface 12 of the light-emitting chip 10 in a vacuum environment.

According to the aforementioned primary characteristics, wavelength of the second light 30 is between 530 nm ~580 nm.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
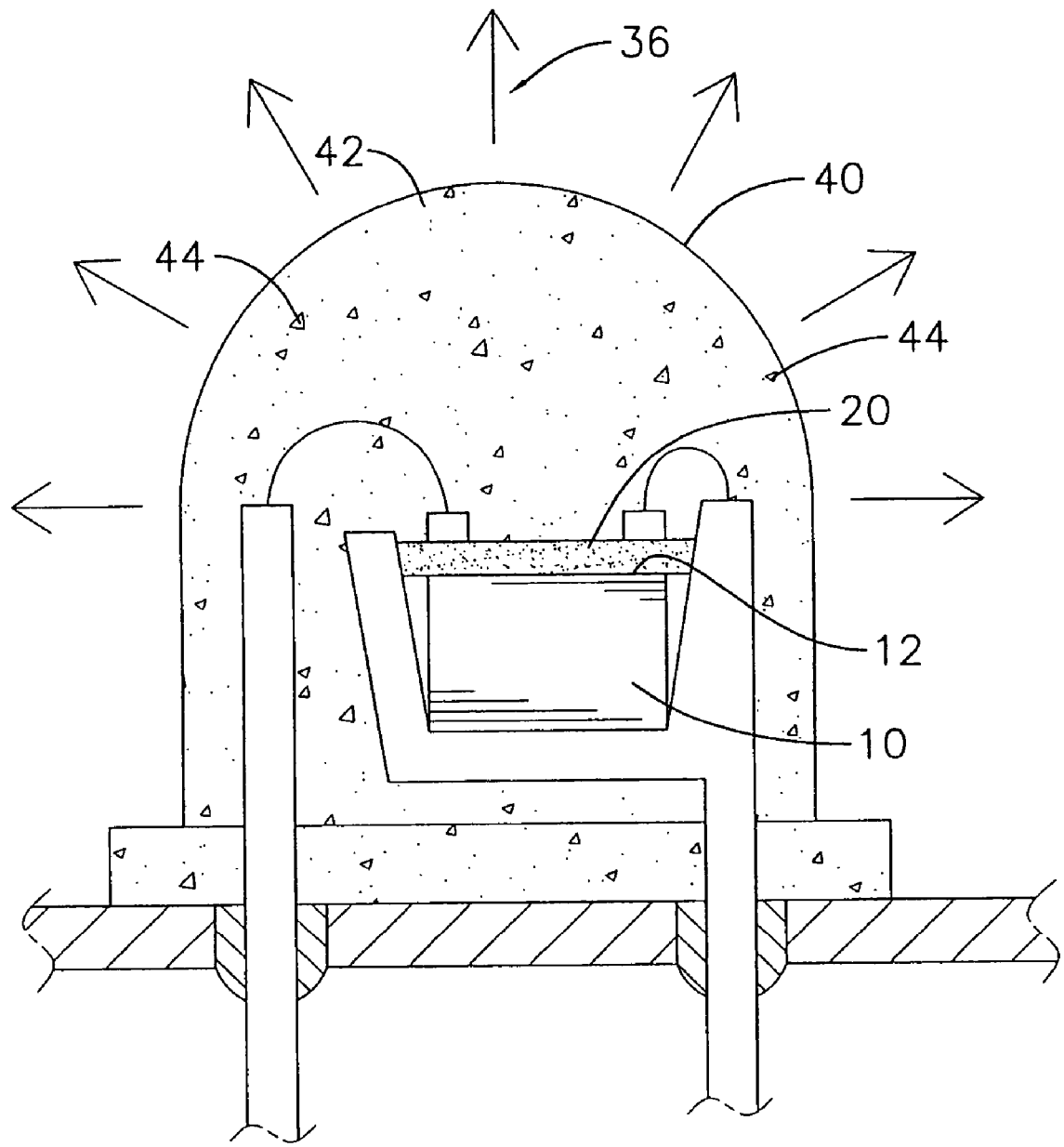
FIG. 1 shows a cross-sectional view according to the present invention.

Referring to FIG. 1, which shows a light-emitting chip 10 functioning as a light-emitting member, and having electrodes connected thereto, which thereby affects emitting light of wavelength between 340 nm~495 nm. Light emitted from a light source 15 of the light-emitting chip 10 includes ultraviolet light, violet light, blue light or blue-green light. Chemical formula of an organic phosphor layer 20 is $(CHCHSC_2CONC_6H_5)_2C_{10}H_7$, which is a macromolecular organic polymer compound material. An organic phosphor polymer in a gasified state, and under high temperature, high pressure vacuum environment, is adhered by evaporation onto a light-emitting surface 12 of the light-emitting chip 10, which thereby forms the organic phosphor layer 20. Preferred thickness of the organic phosphor layer 20 is controlled between 500 A°~5000 A°. However, degree of thickness can also be specified according to requirements. Transparent or translucent nanograde crystal grains 44 are uniformly mixed interior of a transparent encapsulated layer 40. The nanograde crystal grains 44 appear granulated when observed under a microscope, and appear as a powder form when observed with the naked eye.

Figure 2:
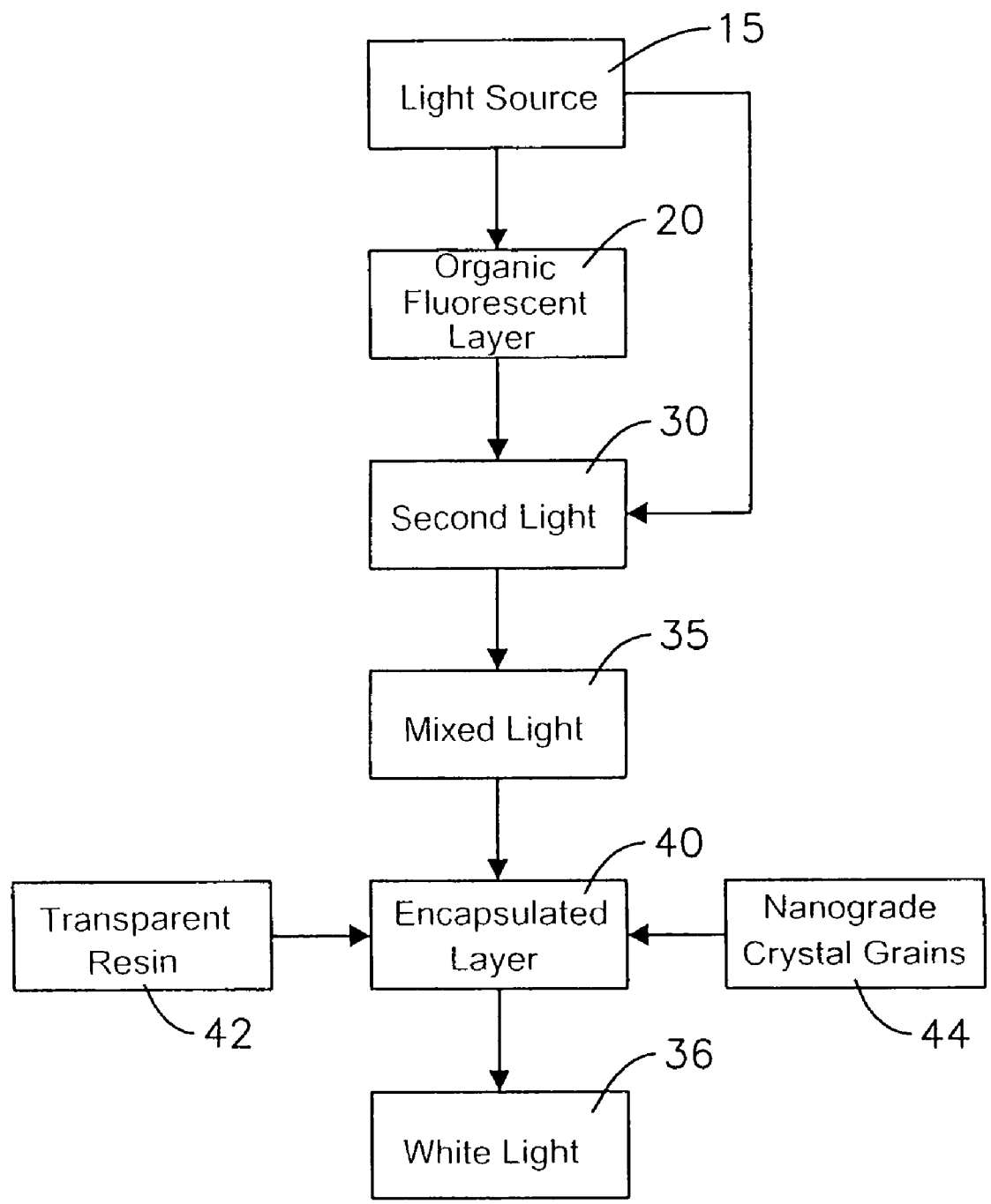
FIG. 2 shows a flowchart according to the present invention.
Figure 3:
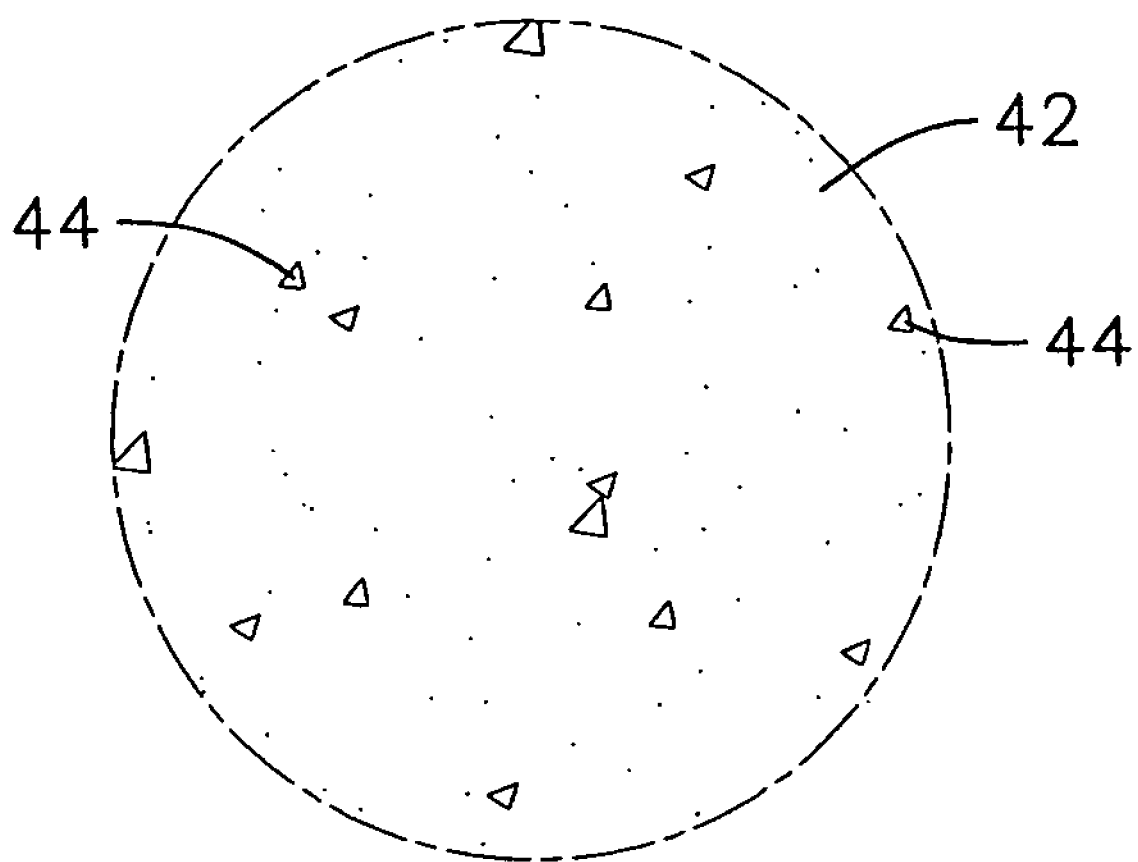
FIG. 3 shows an enlarged partial cross-sectional view of an encapsulated layer according to the present invention.

Referring to FIGS. 2 and 3, upon the light source 15 emitting light of wavelength between 340 nm~495 nm, the light from the light source 15 excites the organic phosphor layer 20, which is thus affected to emit a second light 30 different from the light source 15. Wavelength of the second light is between 530 nm ~580 nm, and is defined to be yellow-green~yellow-orange light. Because the organic phosphor layer 20 has been adhered by evaporation in a gasified form onto the light-emitting surface 12 of the chip 10, thus the organic phosphor layer 20 cools and sets on the surface 12 of the chip 10 with better adhesion and superior uniformity, which thus enhances light emitting intensity and uniformity of the second light 30. The second light 30 thereupon mutually mixes with a portion of the light source 15 that has not been excited by the organic phosphor layer 20, thereby attaining a mixed light 35, which is defined to be white light.

A preferred mixed ratio for a material to construct the encapsulated layer 40 is a uniform mixture of 90% transparent resin and 10% of the transparent or translucent nanograde crystal grains 44, wherein the transparent or translucent nanograde crystal grains 44 exhibit a variety of shapes, such as circular shapes, oval shapes, multi-angled shapes, irregular shapes, and so on, and characteristic properties of the transparent or translucent nanograde crystal grains 44 include light focusing and light refracting. Upon the mixed light 35 being projected onto the transparent encapsulated layer 40, because of ratio of number of the transparent nanograde crystal grains 44 uniformly distributed within the encapsulated layer 40, and because of the aforementioned characteristic properties of the nanograde crystal grains 44, the mixed light 35 becomes extremely mixed, focused, and refracted within the transparent encapsulated layer 40, thus attaining emergence of white light 36 having superior uniformity and color rendering, and stronger light emitting intensity.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A white light light-emitting device comprising:
    a light-emitting chip, which functions as a light-emitting light source, and light emitted from the light source has a wavelength between 340 nm ~495 nm; a macromolecular organic polymer is utilized to form an organic phosphor layer by means of adhering by evaporation onto a surface of the light-emitting chip;
    an encapsulated layer, which provides uniform diffused light, and encapsulates and thereby encloses the light-emitting chip and the organic phosphor layer;
    light emitted from the light source of the light-emitting chip excites the organic phosphor layer, which is thus affected to emit a second light having a wavelength different from that of the light-emitting light source, wavelengths of the second light and a portion of the light source that has not undergone excitation are mutually mixed within the encapsulated layer, thereby forming a mixed light, a plurality of nanograde crystal grains within the encapsulated layer affect focusing and refracting of light rays of the mixed light within the encapsulated layer, whereby the mixed light becomes even more uniformly mixed, and which is subsequently emitted outward from the encapsulated layer, thus attaining white light having superior uniformity and color rendering.

2. The white light light-emitting device according to claim 1, wherein chemical formula of material of the organic phosphor layer is $(CHCHSC_2CONC_6H_5)_2C_{10}H_7$.

3. The white light light-emitting device according to claim 1, wherein material of the encapsulated layer is compounded from mutual mixing of transparent resin and the nanograde crystal grains, and wherein the nanograde crystal grains are transparent or translucent bodies, size of particles of the nanograde crystal grains is controlled to be 100 nanos, and the nanograde crystal grains have physical properties of light focusing and light refracting.

4. The white light light-emitting device according to claim 1, wherein the organic phosphor layer is formed from high-temperature gasified organic phosphor material, which is adhered by evaporation onto the surface of the light-emitting chip in a vacuum environment.

5. The white light light-emitting device according to claim 1, wherein wavelength of the second light is between 530 nm ~580 nm.

* * * * *